United States Patent
Gaben

(10) Patent No.: US 10,804,112 B2
(45) Date of Patent: Oct. 13, 2020

(54) METHOD FOR FORMING A PLANARIZATION STRUCTURE

(71) Applicant: STMicroelectronics (Crolles 2) SAS, Crolles (FR)

(72) Inventor: Loic Gaben, Busque (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 15/979,147

(22) Filed: May 14, 2018

(65) Prior Publication Data

US 2018/0330961 A1    Nov. 15, 2018

(30) Foreign Application Priority Data

May 15, 2017   (FR) ...................................... 17 54243

(51) Int. Cl.
   *H01L 21/306*   (2006.01)
   *H01L 21/02*    (2006.01)
   *H01L 21/311*   (2006.01)
   *B81C 1/00*     (2006.01)
   *H01L 21/321*   (2006.01)

(52) U.S. Cl.
   CPC .... *H01L 21/30625* (2013.01); *B81C 1/00611* (2013.01); *H01L 21/02164* (2013.01); *H01L 21/31111* (2013.01); *H01L 21/3212* (2013.01); *B81C 2201/0121* (2013.01)

(58) Field of Classification Search
   CPC ........... H01L 21/30625; H01L 21/3212; H01L 21/02164; H01L 21/31111; H01L 21/76819; H01L 21/31053
   See application file for complete search history.

(56) References Cited

U.S. PATENT DOCUMENTS

| | | | | |
|---|---|---|---|---|
| 5,792,707 A | * | 8/1998 | Chung | .................. H01L 21/316 438/633 |
| 6,004,863 A | * | 12/1999 | Jang | .................. H01L 21/76229 257/E21.245 |
| 6,395,620 B1 | | 5/2002 | Pan et al. | |
| 6,468,898 B1 | * | 10/2002 | Usami | ............... H01L 21/76811 257/E21.579 |
| 2007/0254478 A1 | * | 11/2007 | Luo | .................. H01L 21/28097 438/682 |
| 2012/0258596 A1 | | 10/2012 | Busch et al. | |

OTHER PUBLICATIONS

INPI Search Report and Written Opinion for FR 1754243 dated Jan. 11, 2018 (7 pages).

* cited by examiner

*Primary Examiner* — Duy Vu N Deo
*Assistant Examiner* — Mahmoud Dahimene
(74) *Attorney, Agent, or Firm* — Crowe & Dunlevy

(57) ABSTRACT

A planarization structure is formed with a planar upper face enclosing a relief projecting from a planar substrate. The process used deposits a layer of a first material over the reliefs and then forms a layer of a second material with a planar upper face. This second material may be etched selectively with respect to the first material. The second layer is processed so that the protuberances of the first material are uncovered. A planarizing is then performed on the first material as far as the layer of the second material by selective chemical-mechanical polishing with respect to the second material.

20 Claims, 3 Drawing Sheets

METHOD FOR FORMING A PLANARIZATION STRUCTURE

PRIORITY CLAIM

This application claims the priority benefit of French Application for Patent No. 1754243, filed on May 15, 2017, the disclosure of which is hereby incorporated by reference in its entirety to the maximum extent allowable by law.

TECHNICAL FIELD

The present invention relates to a method for forming a planarization structure enclosing one or more reliefs formed on a planar upper face of a substrate.

BACKGROUND

A planarization structure lying on a substrate and enclosing reliefs formed on the planar upper face of the substrate may be formed by depositing a self-planarizing material which is deposited directly as a layer having a planar upper face, for example by spin coating of a flowable material, the upper face of which becomes planar following an anneal. Available self-planarizing materials, however, are limited and cannot be adapted to the certain applications.

One conventional method more commonly used for forming a planarization structure enclosing reliefs consists in depositing a layer of a material which is subsequently planarized by chemical-mechanical polishing or chemical-mechanical planarization, CMP.

FIGS. 1A to 1C are schematic sectional views illustrating successive steps of this conventional method for forming a planarization structure.

In FIG. 1A, two reliefs or patterns 1, for example made of silicon oxide, have been formed on the planar upper face of a substrate 3.

In FIG. 1B, a layer 5, for example of polycrystalline silicon, has been deposited on the substrate 3 and the reliefs 1. The layer 5 comprises protuberances 7 above the reliefs 1, and the intention is to planarize this layer 5. The thickness of the layer 5 is greater than the height of the reliefs 1, for example equal to twice their height, so that it can subsequently be planarized by CMP.

In FIG. 1C, the layer 5 has been planarized by CMP as far as the apices of the reliefs 1. In practice, as represented, the upper face of the layer 5 after CMP is not perfectly planar and has hollows 9 between the reliefs 1. These hollows are commensurately deeper when the reliefs 1 are high and distant from one another. By way of example, for two reliefs 1 with a height of 0.2 µm separated from one another by 1 µm, the hollow 9 between these two reliefs 1 may have a depth of about 50 nm.

One drawback of the hollows 9 which are formed between reliefs 1 that are far apart is that the each apex of the reliefs 1 is also polished during the planarization step of FIG. 1C, which leads to a reduction of their height. This reduction of the height of the reliefs 1 depends on the distribution density of these reliefs. If the height of the reliefs 1 defines a parameter of an electronic, optoelectronic or electromechanical device, a spread of the value of this parameter, depending on the distribution density of the reliefs, and therefore a spread of the properties of the device which are connected with this parameter, is observed.

Another drawback of the hollows 9 is that a layer of a material deposited in a subsequent step will be impossible to remove by CMP without further reducing the height of the reliefs 1 and introducing new non-uniformities, or without leaving this material in the hollows 9. For example, the reliefs 1 are sacrificial gates and in subsequent steps the reliefs 1 are removed by selective etching with respect to the layer 5, then a layer of the gate material is deposited over the entire structure before being removed by CMP as far as the layer 5 for forming the gates. In this case, gate material will remain in the hollows 9.

In order to solve the problem of lack of planarity of the layer 5, it has been proposed to form, between the reliefs 1, filling patterns ("dummies") which have the same height as the reliefs 1 but have no functionality. However, this increase in the number of patterns on the upper face of the substrate 3 causes various problems. For example, when the production of these filling patterns involves carrying out a step which is repeated successively for each filling pattern, this leads to an increase in the production time. This is the case, in particular, when the reliefs 1 and the filling patterns are formed by electron-beam ("e-beam") photolithography. Furthermore, the presence of the filling patterns may degrade the functionalities of the reliefs 1, for example, when the device comprising the reliefs 1 is a high-frequency device, by introducing stray capacitances which degrade the properties of the device.

It would be desirable to have a method for forming a planarization structure enclosing reliefs, which overcomes at least some of the drawbacks of the existing methods and makes it possible to obtain a structure which is more planar than that obtained by the method of FIGS. 1A to 1C, without resorting to filling patterns.

SUMMARY

In an embodiment, a method for forming a planarization structure having a planar upper face enclosing a relief projecting from a substrate having a planar upper face, comprises the following steps: a) depositing a layer of a first material; b) forming a layer, having a planar upper face, of a second material which can be etched selectively with respect to the first material; c) selectively etching only a part of a thickness of the layer of the second material in an isotropic manner in order to uncover protuberances of the first material; and d) planarizing the first material as far as the layer of the second material by selective chemical-mechanical polishing with respect to the second material.

According to one embodiment, another layer of the first material is deposited between steps c) and d).

According to one embodiment, the first material is polycrystalline silicon and the second material is silicon oxide.

According to one embodiment, in step c), the layer of the second material is formed by spin coating of Hydrogen silsesquioxane (HSQ) resin followed by an annealing step.

According to one embodiment, the relief is a transistor gate bordered by spacers.

According to one embodiment, the relief has a height of between 0.1 and 3 µm.

According to one embodiment, the method further comprises, after step d), a chemical-mechanical polishing step which is stopped after removal of the layer of the second material.

According to one embodiment, in step a), the first material is deposited over a thickness which is less than the height of the relief.

According to one embodiment, at the end of step c), the upper face of the layer of the second material is at a level which is higher than the apex of the relief.

According to one embodiment, step d) further comprises non-selective chemical-mechanical polishing as far as the apex of the relief.

BRIEF DESCRIPTION OF THE DRAWINGS

These characteristics and advantages, as well as others, will be explained in detail in the following description of particular embodiments, without given limitation and with reference to the appended figures, in which.

DETAILED DESCRIPTION

Elements which are the same have been denoted by the same references in the various figures, and furthermore the various figures are not drawn to scale. For the sake of clarity, only the elements useful for understanding the embodiments described have been represented and are described in detail.

In the following description, the terms "above", "upper", "lower", "apex", "lateral", etc. refer to the orientation of the relevant elements in the corresponding figures. Unless otherwise specified, the expressions "essentially", "about" and "of the order of" mean to within 10%, preferably to within 5%.

FIGS. 2A to 2E are schematic sectional views illustrating successive steps of an embodiment of a method for forming a planarization structure enclosing reliefs.

Figure 2A:
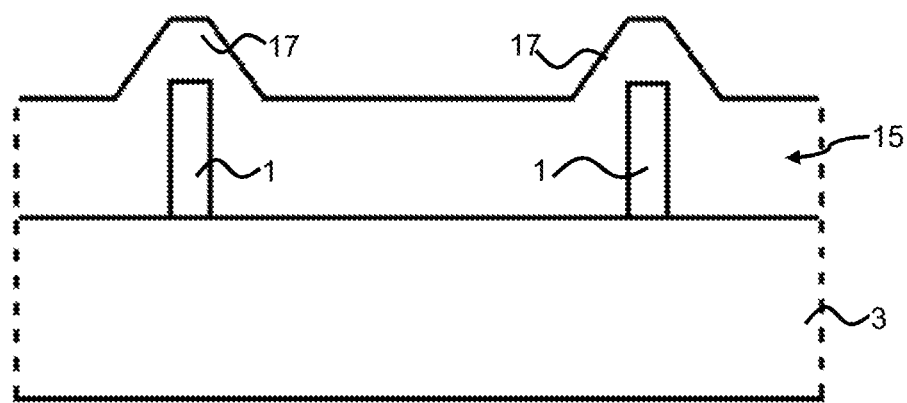
FIGS. 2A to 2E are schematic sectional views illustrating successive steps of an embodiment of a method for forming a planarization structure enclosing reliefs.

In FIG. 2A, a layer 15, for example of polycrystalline silicon, has been deposited on a structure comprising two reliefs 1, which are formed on the planar upper face of a substrate 3. Above each relief 1, the layer 15 has a protuberance 17, for example having a height slightly less than the height of the reliefs 1. The thickness of the layer 15 is less than the height of the reliefs 1, for example by 10 nm, preferably by 5 nm. By way of example, each relief 1 has a height of between 0.1 and 3 µm, for example 0.2 µm. Each relief 1 lies, for example, at a distance of more than 1 µm from the neighbouring reliefs 1.

Figure 2B:
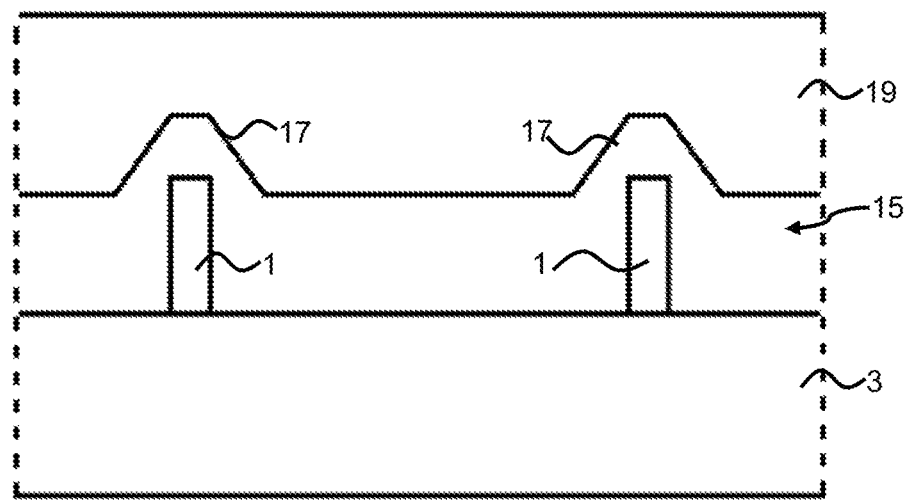

In FIG. 2B, a layer 19 of a material which can be etched selectively with respect to the material of the layer 15, for example a layer of silicon oxide, has been formed on the layer 15 so as to cover the layer 15 and its protuberances 17. For example, the thickness of the layer 19 above the protuberances 17 is about 100 nm. The layer 19 is a layer of a self-planarizing material, and is formed in such a way that its upper face is planar over its entire area, for example with level differences of less than or equal to 5 nm. By way of example, the layer 19 is formed by spin coating of a flowable material, generally followed by an annealing step. This product is, for example, a borophosphosilicate (BPSG for "BoroPhospoSilicate Glass") or a Hydrogen SilsesQuioxane (HSQ) resin.

Figure 2C:
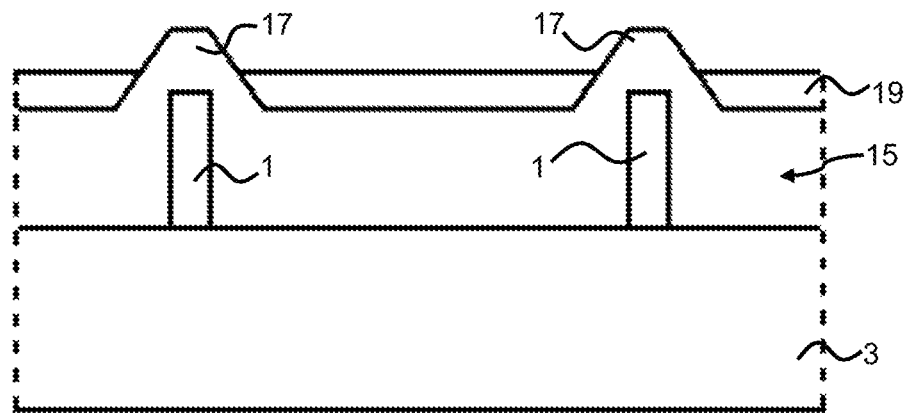

In FIG. 2C, a part of the thickness of the layer 19 is removed by selective isotropic etching with respect to the material of the layer 15, so as to uncover the protuberances 17 and leave in place a part of the thickness of the layer 19 over the planar portions of the upper face of the layer 15. The entire area of layer 19 is etched only for part of its thickness. The thickness left in place of the layer 19 is such that the level of the upper face of the layer 19 is higher than or equal to the level of the apices of the reliefs 1. To this end, the etching time of the layer 19 is, for example, determined during test and/or simulation phases. By way of example, the thickness of the layer 19 left in place lies between 3 and 20 nm, for example 5 nm.

In an alternative embodiment, the viscosity of the self-planarizing material of the layer 19 is such that, in the step of FIG. 2B, the layer 19 is deposited only between the protuberances 17, as represented in FIG. 2C. In this case, the step of FIG. 2C is omitted.

Figure 2D:
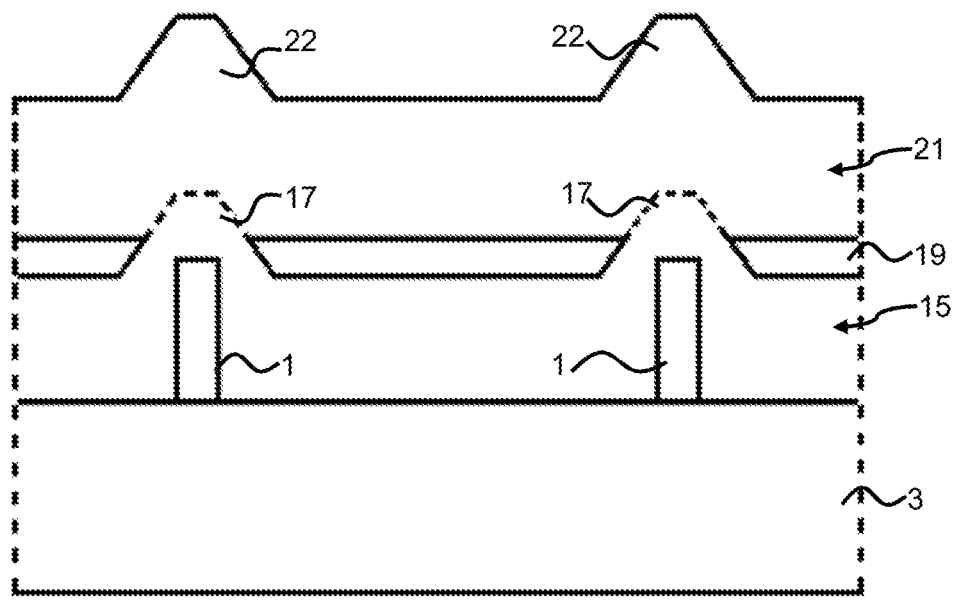

FIG. 2D illustrates an optional step, during which a layer 21 of the same material as the layer 15 has been deposited on the layer 19 and the protuberances 17. The layer 21 comprises protuberances 22 similar to the protuberances 17 of the layer 15. The thickness of the layer 21 is, for example, of the order of 1.5 times the thickness of the layer 15.

Figure 2E:
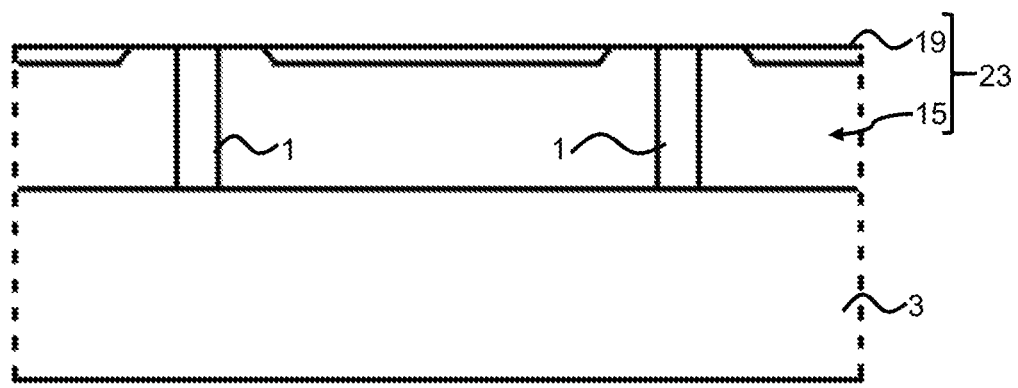

FIG. 2E illustrates a step carried out after the step of FIG. 2C or that of FIG. 2D, during which the material of the layers 21 and 15 of the structure of FIG. 2D or the material of the layer 15 of the structure of FIG. 2C is planarized as far as the upper level of the layer 19. The planarization is carried out by selective CMP with respect to the material of this layer 19. The portions left in place of the layers 15 and 19 then form a planarized layer or structure 23 having a planar upper face, for example with level differences of less than 5 nm. Preferably, the planarization is continued by nonselective CMP as far as the apex of each of the reliefs 1, the apices of the reliefs 1 then being flush with the level of the upper face of the planarization structure 23.

Advantageously, the structure 23 has a more planar upper face when the optional step of FIG. 2D is carried out. Without the optional step, for example, the upper face of the structure 23 has level differences of less than 5 nm, whereas with the optional step they are less than 2.5 nm.

In an optional subsequent step (not illustrated), the layer 19 is removed by nonselective CMP carried out from the planar upper face of the structure 23. Because the CMP is carried out from a planar face, the planarized layer 15 obtained has a planar upper face.

Figure 1A:
FIGS. 1A to 1C, which have been described above, are schematic sectional views illustrating successive steps of an example of a conventional method for forming a planarization structure enclosing reliefs.
Figure 1B:
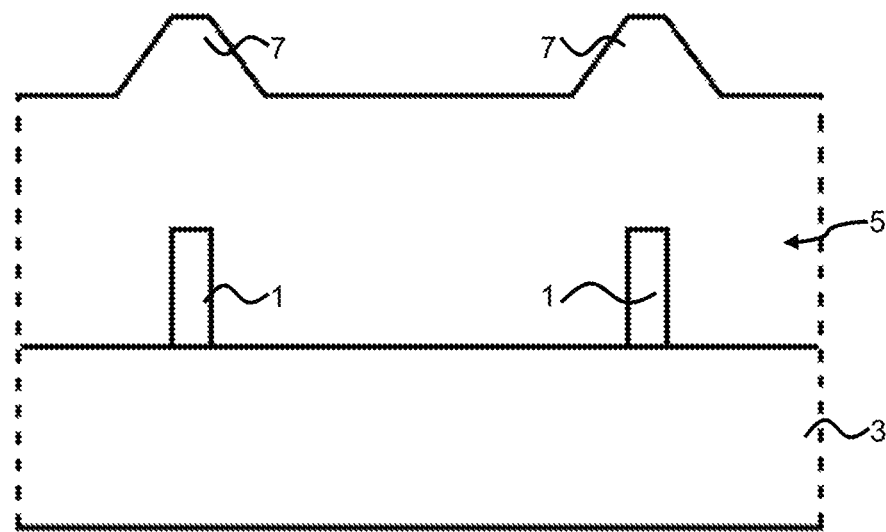
Figure 1C:
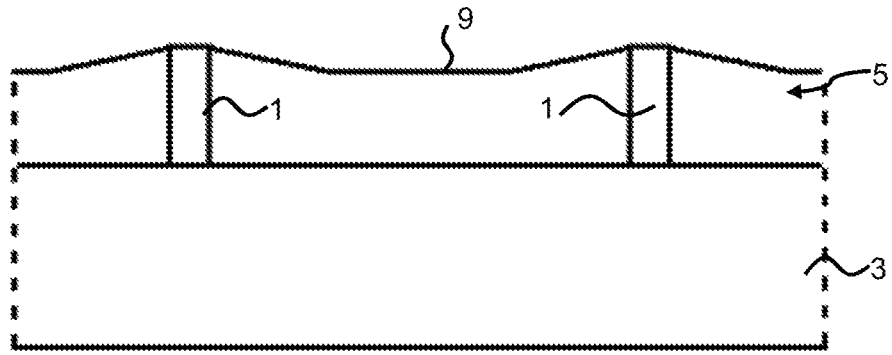

The method described above in connection with FIGS. 2A to 2E makes it possible to form a structure 15 or 23 enclosing the reliefs 1 and advantageously having an upper face which is more planar than that obtained by the method of FIGS. 1A to 1C. Furthermore, it is not necessary to resort to filling patterns in order to achieve this result.

In one alternative embodiment, in the step of FIG. 2C, the isotropic etching is stopped when the upper face of the layer 19 reaches a level lower than that of the apices of the reliefs 1. In the step of FIG. 2E, a part of the apices of the reliefs is then removed during the CMP step, and the structure obtained is identical to that represented in FIG. 2E.

In another variant, in the step of FIG. 2A, the thickness of the layer 15 is greater than or equal to the height of the reliefs 1. In the step of FIG. 2C, the layer 19 is then at a level higher than that of the apices of the reliefs 1, and in the step of FIG. 2E, because the CMP step is stopped on the upper level of the layer 19, the planarized structure 23 obtained covers the apices of the reliefs 1.

Particular embodiments have been described. Various variants and modifications will be apparent to the person skilled in the art. In particular, the substrate 3 having a planar upper face may be any type of support having a planar upper face which is commonly in the production methods of microelectronics. The substrate 3 is, for example, a bulk substrate or a substrate comprising a stack of insulating, semiconducting and/or conducting layers.

The reliefs 1 may consist of one or more materials. These reliefs 1 correspond for example to transistor gates which are bordered by spacers, to sacrificial gates or to channels of transistors, in particular of MOS transistors of the FinFET or nanowire type, to patterns of a plasmon filter, to microelectromechanical systems or nanoelectromechanical systems (MEMs or NEMs), to cores of waveguides or to patterns of an optical device integrated, for example, on silicon, etc.

Although an example of a method for forming the layer 19 in the step of FIG. 2B has been described, any other method making it possible to obtain a layer 19 having a planar upper face may be used by the person skilled in the art.

Layers 15 and 21 of polycrystalline silicon and a layer 19 of silicon oxide have been described by way of example, although these materials may be modified by the person skilled in the art so long as the materials which he selects comply with etching and chemical-mechanical polishing selectivities described above.

Various embodiments with various variants have been described above. It will be noted that the person skilled in the art may combine various elements of these various embodiments and variants without demonstrating an inventive step.

The invention claimed is:

1. A method for forming a planarization structure having a planar upper face enclosing reliefs projecting from a planar upper face of a substrate, comprising the following steps:
   a) depositing a layer of a first material over the reliefs and substrate to be in physical contact with tops of the reliefs and areas of the substrate between the reliefs;
   b) forming a layer of a second material which can be etched selectively with respect to the first material, said layer of the second material having a planar upper face;
   c) selectively isotropically etching only a part of a thickness of the layer of the second material until protuberances of the first material over said reliefs are uncovered; and
   d) planarizing the first material as far as the layer of the second material by selective chemical-mechanical polishing with respect to the second material.

2. The method according to claim 1, wherein another layer of the first material is deposited between steps c) and d).

3. The method according to claim 1, wherein the first material is polycrystalline silicon and the second material is silicon oxide.

4. The method according to claim 1, wherein forming the layer of the second material comprises spin coating of HSQ resin followed by an annealing.

5. The method according to claim 1, wherein each relief is a transistor gate bordered by spacers.

6. The method according to claim 1, wherein each relief has a height of between 0.1 and 3 µm.

7. The method according to claim 1, further comprising, after step d), chemical-mechanical polishing which is stopped after removal of the layer of the second material.

8. The method according to claim 1, wherein depositing the layer of the first material comprises depositing with a thickness that is less than a height of the reliefs.

9. The method according to claim 8, wherein, at the end of step c), the planar upper face of the layer of the second material is at a level which is higher than an apex of the reliefs.

10. The method according to claim 9, wherein step d) further comprises nonselective chemical-mechanical polishing as far as the apex of the reliefs.

11. A method for forming a planarization structure having a planar upper face enclosing reliefs projecting from a planar upper face of a substrate, comprising the following steps:
   a) depositing a layer of a first material over the reliefs and substrate to be in physical contact with apices of the reliefs and areas of the substrate between the reliefs;
   b) forming a layer of a second material different from the first material, said layer of the second material having a planar upper face at a level above the apices of the reliefs but below apices of protuberances of the first material over said reliefs;
   c) depositing a further layer of the first material over the layer of the second material and said protuberances; and
   d) planarizing the protuberances of the first material at least to the planar upper face of the second material.

12. The method according to claim 11, wherein said step d) of planarizing further comprises planarizing said further layer of the first material.

13. The method according to claim 11, further comprising planarizing the layer of the second material to a level coplanar with the apices of the reliefs.

14. The method according to claim 11, wherein the second material can be etched selectively with respect to the first material.

15. The method according to claim 13, wherein forming the layer of the second material comprises depositing the layer of the second material over the protuberances and further selectively etching the layer of the second material down to the level above the apices of the reliefs but below the apices of protuberances.

16. The method according to claim 11, wherein the first material is polycrystalline silicon and the second material is silicon oxide.

17. The method according to claim 11, wherein each relief is a transistor gate bordered by spacers.

18. The method according to claim 11, wherein each relief has a height of between 0.1 and 3 µm.

19. The method according to claim 1, wherein the layer of the second material is planar along its entire upper face after the planarizing of the first material as far as the layer of the second material.

20. The method according to claim 11, wherein the second material has a planar lower face and a planar upper face; wherein the planar upper face and planar lower face are opposing; and wherein the planar lower face makes physical contact with the first material.

\* \* \* \* \*